(12) United States Patent
Jokinen et al.

(10) Patent No.: US 8,698,737 B2
(45) Date of Patent: Apr. 15, 2014

(54) FLEXIBLE APPARATUS

(75) Inventors: Teppo Tapani Jokinen, Espoo (FI); Jarkko Tapio Saunamaki, Vantaa (FI)

(73) Assignee: Nokia Corporation, Espoo (FI)

( * ) Notice: Subject to any disclaimer, the term of this patent is extended or adjusted under 35 U.S.C. 154(b) by 947 days.

(21) Appl. No.: 12/832,385

(22) Filed: Jul. 8, 2010

(65) Prior Publication Data

US 2012/0007796 A1    Jan. 12, 2012

(51) Int. Cl.
*G09G 5/00*    (2006.01)
(52) U.S. Cl.
USPC .......................................... 345/156; 345/173
(58) Field of Classification Search
USPC .................................................. 345/156–179
See application file for complete search history.

(56) References Cited

U.S. PATENT DOCUMENTS

| | | | |
|---|---|---|---|
| 5,324,037 A | 6/1994 | Greeson | 273/155 |
| 5,965,848 A | 10/1999 | Altschul et al. | 174/254 |
| 2006/0061541 A1 | 3/2006 | Ou et al. | 345/107 |
| 2009/0139122 A1 | 6/2009 | Le Gall et al. | 40/518 |
| 2010/0182518 A1 | 7/2010 | Kirmse et al. | 348/836 |

FOREIGN PATENT DOCUMENTS

| | | |
|---|---|---|
| EP | 1794734 | 6/2007 |
| FR | 2852137 A1 | 9/2004 |
| WO | WO-00/71216 A1 | 11/2000 |
| WO | WO 2006/030073 | 3/2006 |
| WO | WO 2009/024971 A2 | 2/2009 |

*Primary Examiner* — Ricardo L Osorio
(74) *Attorney, Agent, or Firm* — Harrington & Smith

(57) ABSTRACT

An apparatus including an elongate structure including integrated electronic circuitry providing at least an electronic user interface wherein the elongate structure is flexible and is configured to be flexed lengthwise by a user to form a looped configuration in which the elongate structure forms at least one lengthwise loop about an axis and in which at least one electrical connection for the electronic circuitry is formed where a first portion of the elongate structure and a second portion of the elongate structure contact.

20 Claims, 3 Drawing Sheets

FLEXIBLE APPARATUS

TECHNOLOGICAL FIELD

Embodiments of the present invention relate to a flexible apparatus. In particular, they relate to a flexible apparatus comprising an electronic user interface.

BACKGROUND

It is now possible to create flexible and/or stretchable electronics. For example, electronic devices may be integrated into stretchable silicon, integrated using semiconducting polymers or integrated on a flexible plastics substrate

BRIEF SUMMARY

According to various, but not necessarily all, embodiments of the invention there is provided an apparatus comprising: an elongate structure comprising integrated electronic circuitry providing at least an electronic user interface wherein the elongate structure is flexible and is configured to be flexed lengthwise to form a looped configuration in which the elongate structure forms at least one lengthwise loop about an axis and in which at least one electrical connection for the electronic circuitry is formed where a first portion of the elongate structure and a second portion of the elongate structure contact.

According to various, but not necessarily all, embodiments of the invention there is provided a method comprising: identifying display areas that are adjacent as a consequence of a looped configuration of a flexible apparatus and that form an extended display area; and allocating portions of an image to respective display areas forming the extended display area such that the image is rendered in the extended display area.

According to various, but not necessarily all, embodiments of the invention there is provided an apparatus comprising: at least one processor; and at least one memory including computer program code the at least one memory and the computer program code configured to, with the at least one processor, cause the apparatus at least to perform: identifying display areas that are adjacent as a consequence of a looped configuration of a flexible apparatus and that form an extended display area; and allocating portions of an image to respective display areas forming the extended display area such that the image is rendered in the extended display area.

BRIEF DESCRIPTION

Figure 1:
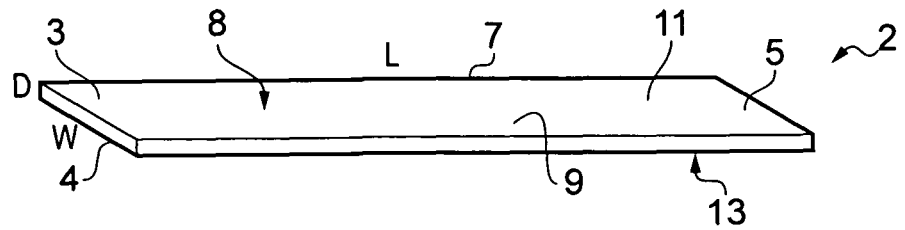
Figure 2:
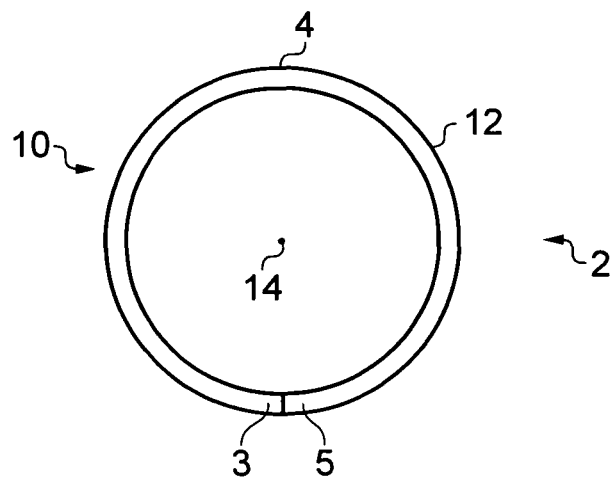
Figure 3:
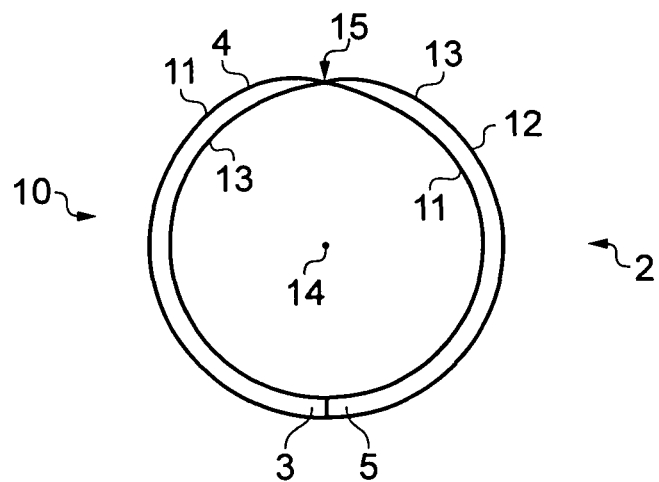
Figure 4:
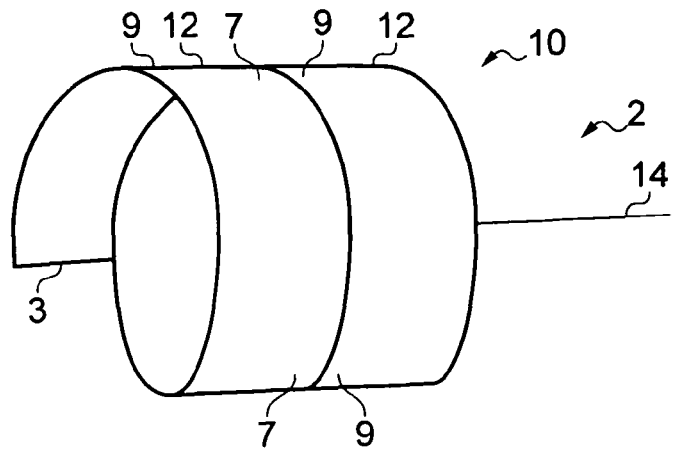
Figure 5:
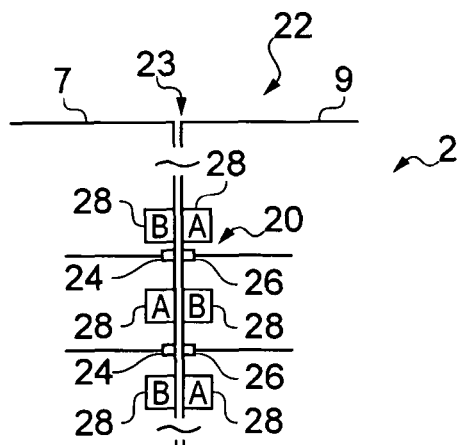
Figures 6A, 6B:
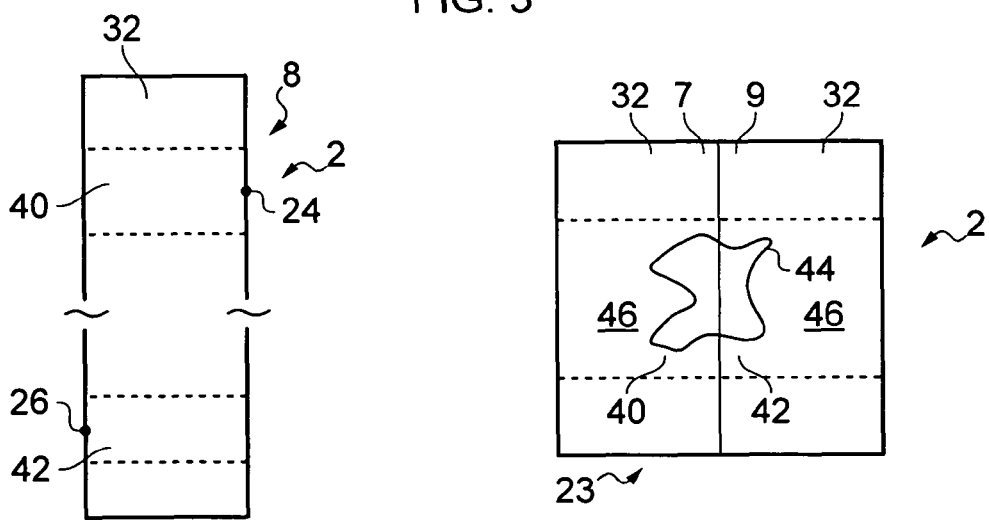
Figure 7:
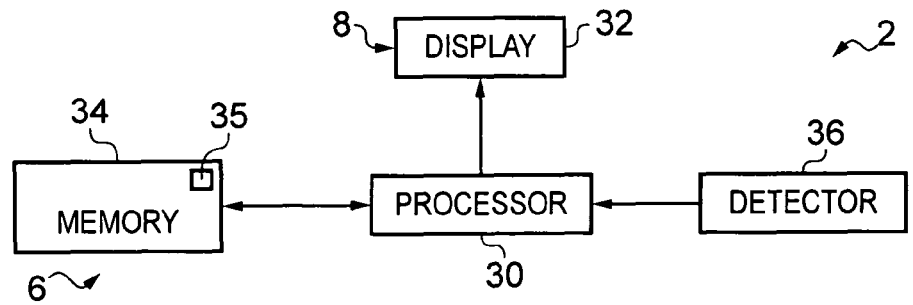
Figure 8:
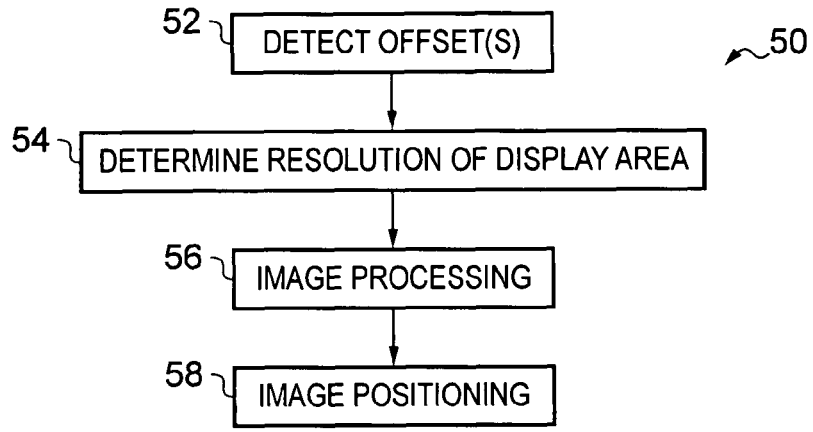
Figures 9A, 9B, 9C, 9D, 9E:
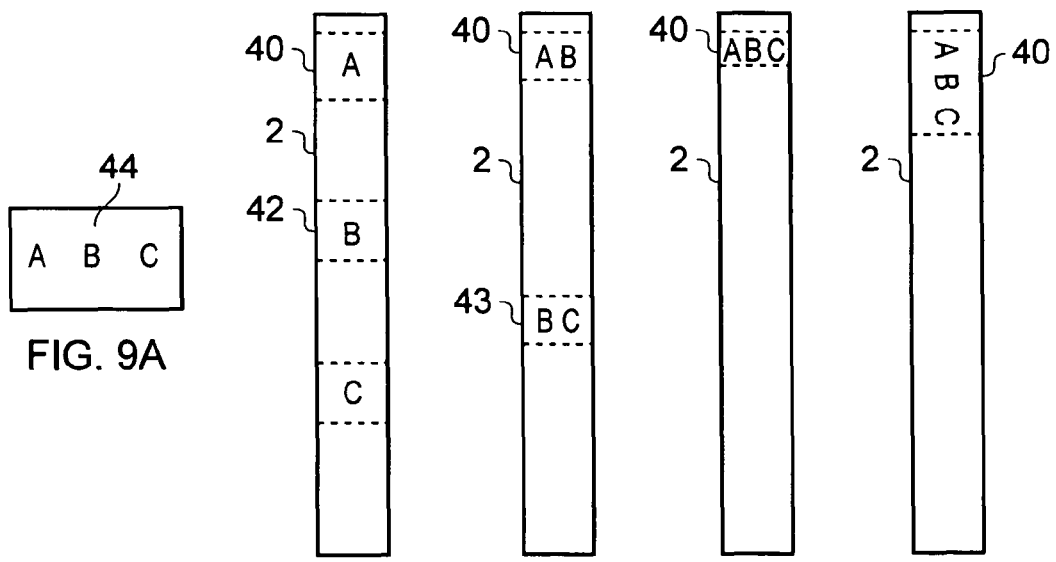

For a better understanding of various examples of embodiments of the present invention reference will now be made by way of example only to the accompanying drawings in which:

FIG. 1 schematically illustrates, from an elevated perspective view, a flexible apparatus;

FIG. 2 schematically illustrates the flexible apparatus in a single-loop configuration;

FIG. 3 schematically illustrates the flexible apparatus in a single-loop with-a-twist configuration;

FIG. 4 schematically illustrates the flexible apparatus in a multi-loop configuration;

FIG. 5 schematically illustrates an example of an alignment mechanism that aligns edges of the apparatus;

FIGS. 6A and 6B schematically illustrate how display areas that are separated lengthwise become adjacent in a multi-loop configuration;

FIG. 7 schematically illustrates example of functional components of the apparatus;

FIG. 8 schematically illustrates a method;

FIG. 9A schematically illustrates an image to be rendered by the apparatus;

FIG. 9B schematically illustrates the rendering of the image by the apparatus when in a three-loop configuration;

FIG. 9C schematically illustrates the rendering of the image by the apparatus when in a two-loop configuration;

FIG. 9D schematically illustrates the rendering of the image by the apparatus when in a single-loop configuration;

FIG. 9E schematically illustrates that an orientation of the image may be dependent upon an orientation of the apparatus.

DETAILED DESCRIPTION

An example of a flexible apparatus 2 will be described with reference to the Figures. Similar references numerals are used in the Figures to designate similar features. For clarity, all reference numerals are not necessarily displayed in all Figures.

FIG. 1 schematically illustrates, from an elevated perspective view, an apparatus 2.

The apparatus 2 comprises a flexible elongate structure 4. The elongate structure 4 has a length L, a width W and a depth D.

In the illustrated example, the length is at least five times greater than the width and the width is at least five times greater than the depth. The elongate structure 4 therefore resembles a band or stripe.

In this illustrated example, the elongate structure 4 has a flat front face 11 and a substantially parallel flat back face 13 when the elongate structure 4 is in an un-flexed configuration (FIG. 1). The elongate structure also comprises opposing lateral edges 7, 9 that extend lengthwise and are separated by width W and also comprises opposing longitudinal edges 3, 5 that extend widthwise and are separated by length L.

The flexible elongate structure 4 comprises integrated electronic circuitry providing at least an electronic user interface 8, which in some embodiments may comprise one or more user input devices and/or one or more user output devices such as, for example, displays.

The flexible elongate structure 4 is configured to be flexed lengthwise by a user to form a looped configuration 10, for example, as illustrated in FIGS. 2, 3 and 4. In these Figures, the flexible elongate structure 4 is formed into at least one lengthwise loop 12 about an axis 14.

The loop may, for example, be configured to extend around or partly around a user's body part or extremity such as head, wrist, finger etc.

The flexibility of the elongate structure 4 may be achieved by, for example, integrating electronics into a flexible material or by supporting electronic components using a flexible interconnecting support.

In the looped configuration 10, at least one electrical connection 20 for the electronic circuitry is formed where a first portion of the elongate structure 4 and a second portion of the elongate structure contact.

In FIGS. 2 and 3, the flexible elongate structure 4 has a looped configuration in which the flexible elongate structure 4 forms a single lengthwise loop 12.

In this looped configuration, the at least one electrical connection 20 for the electronic circuitry is formed where the longitudinal edges 3, 5 contact.

In other embodiments, the flexible elongate structure 4 has a closed multi-looped configuration in which the flexible elongate structure 4 forms multiple lengthwise loops. In this closed multi-looped configuration, the at least one electrical connection 20 for the electronic circuitry is formed where the longitudinal edges 3, 5 contact closing the loops.

In FIG. 3, the flexible elongate structure is configured to be flexible not only length wise but it can also be twisted through 180 degrees as it extends, in the looped configuration, to form the at least one lengthwise loop. This twisted looped configuration forms a Mobius strip. The twist 15 of the elongate structure enables access to both the front face 11 and the back face 13. The front face 11 may comprise a first user interface and the back face 13 may comprise a second user interface and the twist then enables a user to access both user interfaces.

In other embodiments, the flexible elongate structure 4 has a closed, twisted multi-looped configuration in which the flexible elongate structure 4 is twisted and forms multiple lengthwise loops. In this closed, twisted multi-looped configuration, the at least one electrical connection 20 for the electronic circuitry is formed where the longitudinal edges 3, 5 contact closing the loops.

In FIG. 4, the flexible elongate structure 4 has a looped configuration in which the flexible elongate structure 4 forms a spiral having two lengthwise loops about the common axis 14. In this looped configuration, the at least one electrical connection 20 for the electronic circuitry is formed where the lateral edges 7, 9 contact at the interface 23 between adjacent loops 12.

FIG. 5 schematically illustrates an example of an alignment mechanism 22 that aligns edges. In the illustrated example it aligns, at the interface 23, the edges 7, 9 of adjacent loops. In the illustrated example, first nodes 24 at the first loop's right lateral edge 7 and second nodes 26 at the second loop's left lateral edge 9 contact at the interface 23 to form electrical connections 20 of the electronic circuitry.

The alignment mechanism 22 comprises one or more pairs of connectors. The connectors may, for example comprise adhesive, and/or mechanical latching mechanisms and/or magnetic latches.

In the illustrated example of an alignment mechanism 22, the alignment mechanism 22 comprises one or more pairs of magnets 28 of opposite polarity (A, B). For a given pairing of magnets at correct alignment, one magnet of polarity A is attached at or near the edge 7 and another magnet of opposite polarity B is attached at or near the edge 9. When the edge 7 and edge 9 are correctly aligned, the pairings of magnets are formed, which releasably interconnects the edges 7, 9 with the correct alignment so that the connection(s) 20 between the nodes are made.

Referring to FIG. 6A, the user interface 8 may comprise one or more display areas. A first display area 40 adjacent the first node 24 and a second display area 42 adjacent the second node are separated lengthwise along the elongate structure 4 as illustrated in FIG. 6A. However, when the looped configuration (FIG. 4) is created, the first node 24 and second node 26 are aligned and in contact as illustrated in FIG. 6B. The first display area 40 is adjacent the second display area 42 and an extended display area 46 comprising both the first display area 40 and the second display area 42 is formed.

The apparatus 2 is configured to control the first display area 40 and the now adjacent second display area 42 to form an image 44 on the extended display area 46 that spans the contact interface 23.

As schematically illustrated in FIG. 7, the apparatus 2 may comprise a processor 30, a memory 34, one or more displays 32 and a detector 36.

The processor 30 is configured to read from and write to the memory 34. The processor 30 may also comprise an output interface via which data and/or commands are output by the processor 30 and an input interface via which data and/or commands are input to the processor 30.

The memory 34 stores a computer program 35 comprising computer program instructions that control the operation of the apparatus 2 when loaded into the processor 30. The computer program instructions 35 provide the logic and routines that enables the apparatus to perform the methods illustrated in FIG. 8, for example. The processor 30 by reading the memory 34 is able to load and execute the computer program 35.

The computer program may arrive at the apparatus 2 via any suitable delivery mechanism. The delivery mechanism may be, for example, a computer-readable storage medium, a computer program product, a memory device, a record medium such as a CD-ROM or DVD, an article of manufacture that tangibly embodies the computer program. The delivery mechanism may be a signal configured to reliably transfer the computer program. The apparatus may propagate or transmit the computer program as a computer data signal.

Although the memory 34 is illustrated as a single component it may be implemented as one or more separate components some or all of which may be integrated/removable and/or may provide permanent/semi-permanent/dynamic/cached storage.

The processor 30 is configured to provide an operational user interface 8. In this example the user interface 8 comprises a display. In other examples, the user interface may comprise more than one display and all or some of the displays may be flexible. Also, in other example, the user interface may detect input from a user in addition or as an alternative to providing output to a user.

The detector 36 may be configured to detect a looped configuration 10 of the elongate structure. For example, the detector may detect the extent of flexing of the elongate structure 4. Alternatively, the detector 36 may detect which node pairings 24, 26 are formed across the interface 23.

The apparatus 2 may, for example, perform the method illustrated in FIG. 8.

At block 52 of method 50, the processor 30 determines the lengthwise separation (offset) S between two paired nodes using the detector output.

At block 54, the processor 30 can estimate the number of loops N where N=L/S. The processor 30 is then able to determine the resolution of the extended display area. If the standard widthwise resolution of the display is X, then the widthwise resolution in the looped configuration is increased to N*X. The lengthwise dimension of the extended display area may then be adjusted to Y to maintain or to achieve a particular aspect ratio Y:N*X or N*X:Y.

At block 56, the image is adjusted to fit the extended display area with its new resolution. This may for example require interpolation between pixels as is known in the art. The image is then divided into a portion for each display area that are adjacent as a consequence of the looped configuration.

At block 58, the processor 30 is configured to identify the display areas that are adjacent as a consequence of the looped configuration and that are to be used to form the extended display area for displaying the processed image. The respective portions of the image determined at block 56 are allocated to respective display areas such that the whole image is rendered in the extended display area by rendering portions of the image on the adjacent display areas.

FIG. 9A schematically illustrates an image 44 to be rendered by the apparatus 2.

In FIG. 9A, the processor 30 renders three distinct portions of the image 44 at three distinct display regions which in the looped configuration 10 are adjacent forming an extended display area 46. The image 44 extends across the interfaces between the display areas.

In FIG. 9B, the processor 30 renders two distinct portions of the image 44 at two distinct display regions which in the looped configuration 10 are adjacent forming an extended display area. The image 44 extends across the interface between the display areas.

In FIG. 9C, the processor 30 renders the whole image 44 at a single display region when the looped configuration has a single loop.

In FIG. 9D, the detector 36 detects the orientation of the elongate structure using a magnetometer, accelerometer or gyroscope for example and renders the image 44 either in landscape or portrait depending upon orientation. Although illustrated as a variant of the embodiment illustrated in FIG. 9D it is also applicable to the embodiments illustrated in FIGS. 9B and 9C, for example.

The blocks illustrated in the FIG. 8 may represent steps in a method and/or sections of code in the computer program 35. The illustration of a particular order to the blocks does not necessarily imply that there is a required or preferred order for the blocks and the order and arrangement of the block may be varied. Furthermore, it may be possible for some blocks to be omitted.

Although embodiments of the present invention have been described in the preceding paragraphs with reference to various examples, it should be appreciated that modifications to the examples given can be made without departing from the scope of the invention as claimed.

Features described in the preceding description may be used in combinations other than the combinations explicitly described.

Although functions have been described with reference to certain features, those functions may be performable by other features whether described or not.

Although features have been described with reference to certain embodiments, those features may also be present in other embodiments whether described or not.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

We claim:

1. An apparatus comprising an elongate structure comprising integrated electronic circuitry providing at least an electronic user interface wherein the elongate structure is flexible and is configured to be flexed lengthwise to form a looped configuration in which the elongate structure forms at least one lengthwise loop about an axis and in which at least one electrical connection for the electronic circuitry is formed where a first portion of the elongate structure and a second portion of the elongate structure contact, wherein a first display area adjacent the first portion and a second display area adjacent the second portion are separated lengthwise along the elongate structure and wherein the apparatus is configured to control the first display area adjacent the first portion and the second display area adjacent the second portion to form an image, on an extended display area that comprises the first display area and the second display area, that spans a contact interface between the first portion and the second portion.

2. An apparatus as claimed in claim 1, wherein the elongate structure has a length, a width and a depth and wherein the length is at least five times greater than the width and the width is at least five times greater than the depth.

3. An apparatus as claimed in claim 1, wherein the elongate structure has a flat front face and a substantially parallel flat back face.

4. An apparatus as claimed in claim 1, wherein the first portion is a first edge and the second portion is a second edge opposing the first edge.

5. An apparatus as claimed in claim 4, wherein the first and second edges are lateral edges that extend lengthwise and wherein the elongate structure is configured to form a looped configuration comprising more than one loop about a common laterally extending axis.

6. An apparatus as claimed in claim 4, wherein the first and second edges are longitudinal edges that extend widthwise and wherein the elongate structure is configured to form a looped configuration comprising a single loop.

7. An apparatus as claimed in claim 1, wherein the elongate structure is configured to be twisted through 180 degrees as it extends, in the looped configuration, to form the at least one lengthwise loop.

8. An apparatus as claimed claim 6, wherein the elongate structure comprises a front face and a back face, wherein the twisting of the elongate structure enables access to both the front face and the back face, wherein the front face comprises a first user interface and the back face comprises a second user interface.

9. An apparatus as claimed in claim 1, further comprising an alignment mechanism that aligns a node at the first portion and a node at the second portion to enable the formation of the electrical connection via node to node contact.

10. An apparatus as claimed in claim 9, wherein the alignment mechanism comprises at least one pair of magnets of opposite polarity, wherein, for each pair of magnets, one magnet is attached at the first portion and another magnet is attached at the second portion.

11. An apparatus as claimed in claim 1, wherein the first portion of the elongate structure and the second portion of the elongate structure are user-attachable and are user-detachable.

12. An apparatus as claimed in claim 1, wherein the user interface comprises at least one flexible display.

13. An apparatus comprising an elongate structure comprising integrated electronic circuitry providing at least an electronic user interface wherein the elongate structure is flexible and is configured to be flexed lengthwise to form a looped configuration in which the elongate structure forms at least one lengthwise loop about an axis and in which at least one electrical connection for the electronic circuitry is formed where a first portion of the elongate structure and a second portion of the elongate structure contact, wherein the apparatus is configured to detect a looped configuration of the elongate structure and is configured to enable rendering of the image on an extended display area formed by display areas that are adjacent as a consequence of the looped configuration.

14. An apparatus as claimed in claim 13, wherein the apparatus is configured to detect a looped configuration of the elongate structure and is configured to process the image to enable rendering of the image on the extended display area formed by display areas that are adjacent as a consequence of the looped configuration.

15. An apparatus as claimed in claim 13, wherein the apparatus is configured to identify the display areas that are adjacent as a consequence of the looped configuration and that form the extended display area and to allocate portions of the image to respective display areas such that the image is rendered in the extended display area.

16. A method comprising:
   identifying display areas that are adjacent as a consequence of a looped configuration of a flexible apparatus and that form an extended display area; and
   allocating portions of an image to respective display areas forming the extended display area such that the image is rendered in the extended display area.

17. A method as claimed in claim 16, further comprising:
   processing the image to enable rendering of the image at a resolution provided by the extended display area.

18. An apparatus comprising:
   at least one processor; and
   at least one memory including computer program code
   the at least one memory and the computer program code configured to, with the at least one processor, cause the apparatus at least to perform:
   identifying display areas that are adjacent as a consequence of a looped configuration of a flexible apparatus and that form an extended display area; and
   allocating portions of an image to respective display areas forming the extended display area such that the image is rendered in the extended display area.

19. An apparatus as claimed in claim 18 wherein the at least one memory and the computer program code are configured to, with the at least one processor, cause the apparatus at least to perform:
   processing the image to enable rendering of the image at a resolution provided by the extended display area.

20. A computer program stored on a non-transitory computer-readable medium, said computer program comprising computer program instructions that, when executed by at least one processor, enable an apparatus at least to perform:
   identifying display areas that are adjacent as a consequence of a looped configuration of a flexible apparatus and that form an extended display area; and
   allocating portions of an image to respective display areas forming the extended display area such that the image is rendered in the extended display area.

* * * * *